(12) United States Patent
Glass et al.

(10) Patent No.: US 8,183,903 B2
(45) Date of Patent: May 22, 2012

(54) SIGNAL INTERPOLATION METHODS AND CIRCUITS

(75) Inventors: Kevin William Glass, Scottsdale, AZ (US); Michael Terry Nilsson, Hermosa Beach, CA (US)

(73) Assignee: Semtech Corporation, Camarillo, CA (US)

( * ) Notice: Subject to any disclaimer, the term of this patent is extended or adjusted under 35 U.S.C. 154(b) by 56 days.

(21) Appl. No.: 12/630,601

(22) Filed: Dec. 3, 2009

(65) Prior Publication Data

US 2011/0133783 A1    Jun. 9, 2011

(51) Int. Cl.
*H03H 11/16* (2006.01)
(52) U.S. Cl. ........................ 327/231; 327/237
(58) Field of Classification Search ............... None
See application file for complete search history.

(56) References Cited

U.S. PATENT DOCUMENTS

| | | | | |
|---|---|---|---|---|
| 7,092,691 B2 * | 8/2006 | Bohn et al. | ............. | 455/280 |
| 7,405,691 B2 * | 7/2008 | Makigawa et al. | ......... | 341/159 |
| 7,512,331 B2 * | 3/2009 | Kim | ........................ | 396/133 |
| 7,541,844 B2 | 6/2009 | Chiu et al. | | |
| 7,583,070 B2 * | 9/2009 | Nazarian | ................... | 323/315 |
| 2009/0251225 A1 * | 10/2009 | Chen et al. | ................ | 331/1 A |

* cited by examiner

*Primary Examiner* — Cassandra Cox
(74) *Attorney, Agent, or Firm* — McDermott Will & Emery LLP

(57) ABSTRACT

An interpolation circuit for comparing an input voltage signal with an interpolated reference signal derived from a first reference voltage signal and a second reference voltage signal may include a transconductive circuit configured to generate a first differential current signal proportional to a difference between the first reference voltage signal and the input voltage signal and a second differential current signal proportional to a difference between the second reference voltage signal and the input voltage signal, an intermediate circuit configured to generate a third differential current signal, and a transinductive circuit configured to generate an output voltage signal having a first polarity if a value of the input voltage signal is greater than a value of the interpolated reference signal and a second polarity if the value of the input signal is less than the value of the interpolated reference signal.

19 Claims, 8 Drawing Sheets

SIGNAL INTERPOLATION METHODS AND CIRCUITS

FIELD

The present disclosure relates in general to circuits, and more particularly to, signal interpolation methods and circuits.

BACKGROUND

Analog-to-digital conversion (ADC) is often used to sample analog signals so that such signals may be digitally represented. The need for digital representation of analog signals arises in a variety of applications such as digital communication receivers.

A variety of techniques to perform ADC are well known in the art. Two common techniques include the successive approximation (SA) ADC and the flash ADC. An SA ADC circuit generally produces a digital representation by processing an input analog signal through successive stages, each stage comprising a comparator configured to get a successively more accurate digital representation of the input analog signal. In a typical flash ADC circuit, an input analog signal value is compared with various reference levels, all at once, using multiple comparators. All other things being equal, because a flash ADC circuit has a single stage of comparators instead of multiple stages of comparators as in an SA ADC circuit, a flash ADC circuit typically produces a digital representation of an analog input signal with lower latency than an SA ADC circuit. Therefore, the flash ADC technique is generally considered more suitable for a high speed application. In some flash ADC systems, the resolution of the digital representation may be improved by using a combination of a comparator stage followed by an interpolation stage for producing additional comparison results by comparing the analog input voltage signal with interpolated reference voltage levels.

With the increasing demand for high data rates and constellation densities, for example, in signals transmitted in the Giga Hertz (GHz) range, the demand for low power consumption, fast, and accurate high speed ADC is ever increasing. When using a flash ADC circuit, this in turn may require each stage of the flash ADC circuit, such as an interpolation stage, to be implemented using an accurate, high speed circuit.

In certain aspects of the disclosure, a better interpolation circuit is needed to meet the increased speed, power, and accuracy requirements.

SUMMARY

In an aspect of the disclosure, an interpolation circuit for comparing an input voltage signal with an interpolated reference signal derived from a first reference voltage signal and a second reference voltage signal may include one or more of the following: a transconductive circuit configured to generate a first differential current signal proportional to a difference between the first reference voltage signal and the input voltage signal and a second differential current signal proportional to a difference between the second reference voltage signal and the input voltage signal, an intermediate circuit configured to generate a third differential current signal using a first component current signal from the first differential current signal and a second component current signal from the second differential current signal, and a transinductive circuit configured to generate an output voltage signal having a first polarity if a value of the input voltage signal is greater than a value of the interpolated reference signal and a second polarity if the value of the input signal is less than the value of the interpolated reference signal. The interpolated reference signal may comprise an average of the first reference voltage signal and the second reference voltage signal.

In another aspect of the disclosure, a method for comparing an input voltage signal with an interpolated signal derived from a first reference voltage signal and a second reference voltage signal may include one or more of the following: operating a transconductive circuit to generate a first differential current signal proportional to a difference between the first reference voltage signal and the input voltage signal and a second differential current signal proportional to a difference between the second reference voltage signal and the input voltage signal, operating an intermediate circuit to generate a third differential current signal using a first component current signal from the first differential current signal and a second component current signal from the second differential current signal, and operating a transinductive circuit to generate an output voltage signal having a first polarity if a value of the input voltage signal is greater than a value of the interpolated signal and a second polarity if the value of the input signal is less than the value of the interpolated signal.

In yet another aspect of the disclosure, an interpolation circuit may comprise a transconductive circuit configured to generate a plurality of differential current signals responsive to a plurality of reference voltage signals and an input voltage signal, and a transinductive circuit configured to generate, based on the plurality of differential current signals, a plurality of output voltage signals responsive to a digital representation of a value of the input voltage signal.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
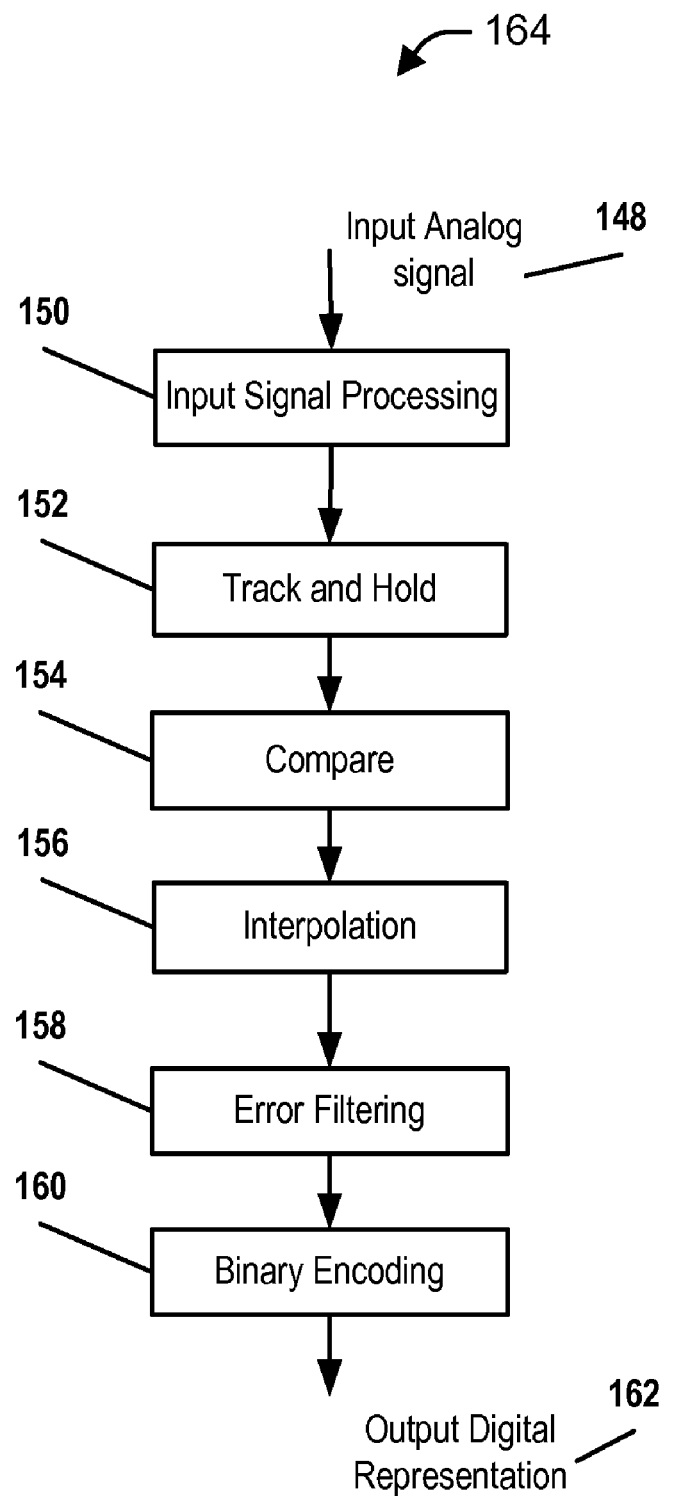
FIG. 1 is a functional block diagram of a flash analog-to-digital conversion circuit in accordance with certain configurations of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known circuit elements and components are shown in block diagram form in order to avoid obscuring the concepts of the subject technology. Like components are labeled with identical element numbers for ease of understanding.

Analog-to-digital conversion (ADC) processing may be used in a variety of applications including digital communication systems and digital signal and image processing systems. One approach to ADC, particularly when high data rates are involved, may be referred to as a flash ADC. In a typical flash ADC system, an analog input voltage signal may be sampled and the amplitude of the sampled signal may be compared with multiple digital reference signals, typically all at once, to generate a digital representation. Each bit in this digital representation may indicate if the value of the analog input signal is greater or less than the value of a corresponding reference voltage signal.

To reduce the power consumed in a comparison operation, among other benefits, a technique sometimes called interpolated flash ADC is used. In a typical interpolated flash ADC, a reduced number of pre-amplifier and comparator stages (typically one-half) may be used to produce a corresponding number of "primary" reference voltage signals with which an input voltage signal is compared. The resolution of the results of comparison with the primary reference voltage signals may be improved by an interpolation stage. In the interpolation stage, a number of secondary reference voltage signal values may be generated. The secondary reference voltage signal values typically correspond to values half-way between the primary reference signal voltage values. The secondary reference voltage signal values may then be compared with the analog input signal to produce additional comparison results representing whether the analog input signal may be greater than or less than the secondary reference voltage signal values.

In practice, circuit implementation of an interpolation stage may require various design trade-offs. For example, additional calculations of the secondary voltage reference signals may reduce total power consumption but may add to the end-to-end delay of the ADC. Therefore, a technique of implementing an interpolation stage that reduces delay of calculations of interpolated reference signals may be suitable for a high-speed flash ADC circuit.

Certain configurations of the present disclosure may solve the above discussed and other problems related to an interpolated flash ADC system. Certain configurations of the present disclosure solve these problems at least by performing generation of and comparison with the secondary reference signals in the current domain (as opposed to voltage domain). In certain aspects, performing interpolation in the current domain may advantageously lend itself to a high speed implementation due to a reduction in degradation from undesirable capacitive coupling between input/output terminals of a transistor.

Certain configurations of the present disclosure may solve the above discussed and other problems related to an interpolated flash ADC system by using bipolar junction transistors (BJT) for circuit implementation of the interpolation stage. In certain aspects, certain configurations of the present disclosure may benefit from the property of BJT transistors that BJT implementations exhibit better high-speed performance in comparison to corresponding implementations using Metal Oxide Semiconductor (MOS) or Metal Oxide Semiconductor Field Effect Transistor (MOSFET) technology.

Certain configurations of the present disclosure may solve the above discussed and other problems related to an interpolated flash ADC system by implementing an interpolation stage circuit with a reduced number of circuit components (e.g., transistors, resistors, etc.). In certain aspects, the reduced component count may be beneficial in keeping circuit area and power consumption to a minimum.

Certain configurations of the present disclosure may solve the above discussed and other problems related to an interpolated flash ADC system by performing the interpolation in the current domain using matched transistor pairs. The use of matched transistor pairs may make high yield, high accuracy semiconductor implementations possible.

In one aspect, the term "bipolar junction transistor (BJT)" may refer to any of a variety of multi-terminal transistors generally operating on the principal of carrying current using both electrons and holes, including but not limited to an n-p-n BJT, a p-n-p BJT, and a heterojunction BJT (HBT).

In one aspect, the term "field effect transistor (FET)" may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms "base," "emitter," and "collector" may refer to three terminals of a transistor and may refer to a base, an emitter, and a collector of a bipolar junction transistor. In another aspect, a base, an emitter, and a collector may refer to a gate, a source, and a drain of a field effect transistor, respectively. In another aspect, the terms "gate," "source," and "drain" may refer to "base," "emitter," and "collector" of a transistor, respectively.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

FIG. 1 is a functional block diagram of a flash analog-to-digital conversion (ADC) circuit 164 in accordance with certain configurations of the present disclosure. A flash ADC circuit may be implemented to obtain, for example, a 6-bit digital representation of an OC-768 compliant analog signal comprising 38,486.016 Mbit/s data traffic in a communication receiver. The flash ADC circuit 164 converts an input analog signal 148 to an output digital representation 162. The input analog signal 148 may be processed in an input signal processing block 150. The input signal processing block 150 may, for example, perform the task of matching impedance of the flash A/D circuit 164 to a previous block. The input signal processing block 150 may also generate multiple reference signals, using for example a resistive ladder. A track-and-hold (T/H) block 152 may sample the input analog signal 148 and hold the sampled value constant, as a sampled output signal, for a duration required for the subsequent processing.

Still referring to FIG. 1, a compare block 154 may compare the sampled output signal output by the T/H block 152 to a plurality of reference signals to produce an estimate of the signal level for the input analog signal 148. The input signal processing block 150 may produce the plurality of reference signals using a well known technique such as a resistive ladder. The compare block 154 may produce a result of the estimate of the signal level for the input analog signal 148 represented as a plurality of bits, each bit indicating whether the input analog signal 148 is greater in magnitude or less than the magnitude of a corresponding reference signal value.

Still referring to FIG. 1, the resolution and accuracy of the estimate produced at the output of the compare block 154 may be improved by using interpolation block 156. The interpolate block 156 may interpolate reference signal values used in the comparisons performed in the compare block 154 (primary reference signal values) to generate secondary reference signal values. The interpolate block 156 may compare the input analog signal 148 with the (interpolated) secondary reference signal values to produce a plurality of output signals corresponding to the results of comparisons. Each of the secondary reference signal value may represent an average of two adjacent primary reference signal values. The results of the comparisons, including both the results of comparison of the input analog signal 148 with the primary reference signal values and the secondary reference signal values, may be represented in a digital representation such as a thermometer code. In certain configurations, the results of the comparison may be filtered in an error filtering block 158 to remove errors of measurements. In certain configurations, such as bubble error suppression configurations, the error filtering block 158 and the binary encoding block 160 may be implemented simultaneously to produce the output digital representation 162. Co-pending U.S. patent application Ser. No. 12/551,452 titled "THERMOMETER CODE TRANSCODING METHODS AND SYSTEMS," filed Aug. 31, 2009, incorporated herein by reference in its entirety, discloses a number of thermometer code transcoding techniques that suppress errors in the digital representation of an analog signal.

Figure 2:
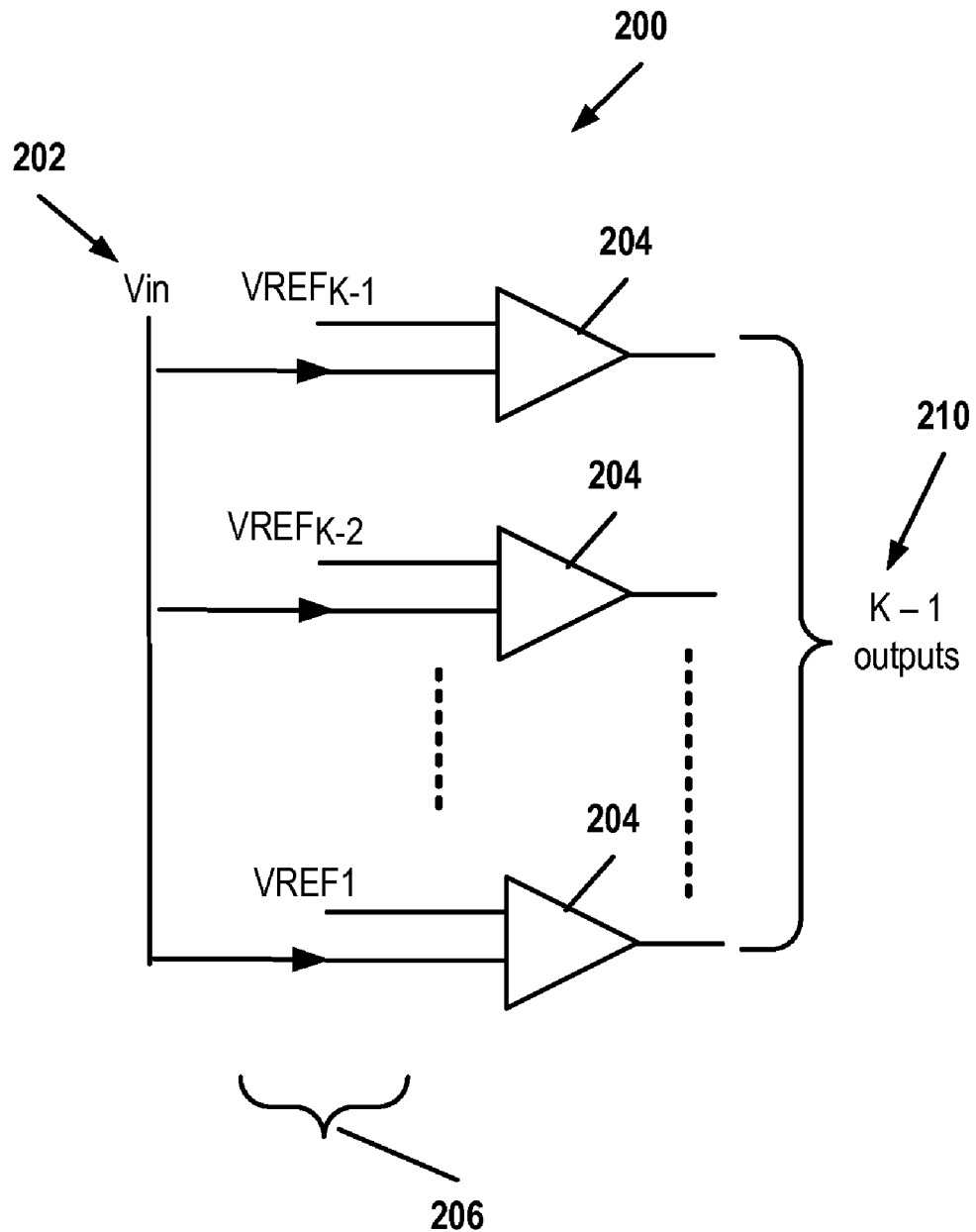
FIG. 2 is a block diagram of an exemplary compare section, in accordance with certain configurations of the present disclosure.

FIG. 2 is a block diagram illustrating an exemplary compare block 200 of a flash ADC, in accordance with certain configurations of the present disclosure. Compare block 200 may, for example, be used in a "non-interpolated" flash ADC (i.e., a flash ADC that may not be using an interpolation block 156). For an N-bit flash ADC, compare block 200 may comprise K−1 comparators 204, where $K=2^N$. The K−1 reference voltage signals 206 $VREF_1$ to $VREF_{K-1}$ may be generated from a reference signal VREF (not shown), by dividing VREF in K equal levels (e.g., using a resistive ladder). Output of each comparator 204 may be converted to a logical "1" or "0" value indicating whether input voltage signal Vin 202 is greater than or less than the corresponding reference voltage signal 206 input to the comparator. Compare block 200 may produce K−1 outputs 210, each corresponding to a result of comparison of the input voltage signal Vin 202 with a reference voltage signal.

By way of example, and not limitation, for a 6-bit flash ADC circuit, compare block 200 may comprise 63 comparators ($2^6-1$). The comparators may compare a value of an input voltage signal with signal values VREF/64, 2*VREF/64, 3*VREF/64, . . . , 63*VREF/64, derived from a reference voltage VREF. In contrast, as described in details below, an interpolated flash ADC configuration may comprise 32 comparators in the compare block 154, followed by 31 additional comparisons in the interpolation block 156. For example, the compare block 154 of an interpolated flash ADC may perform signal comparisons with thirty two primary reference signals corresponding to the signal values 2*VREF/64, 4*VREF/32, . . . , 62*VREF/64 and VREF, and the interpolation block 156 may perform comparison with thirty one secondary reference signal values corresponding to the values VREF/64, 3*VREF/64, . . . , 63*VREF/64.

Figure 3:
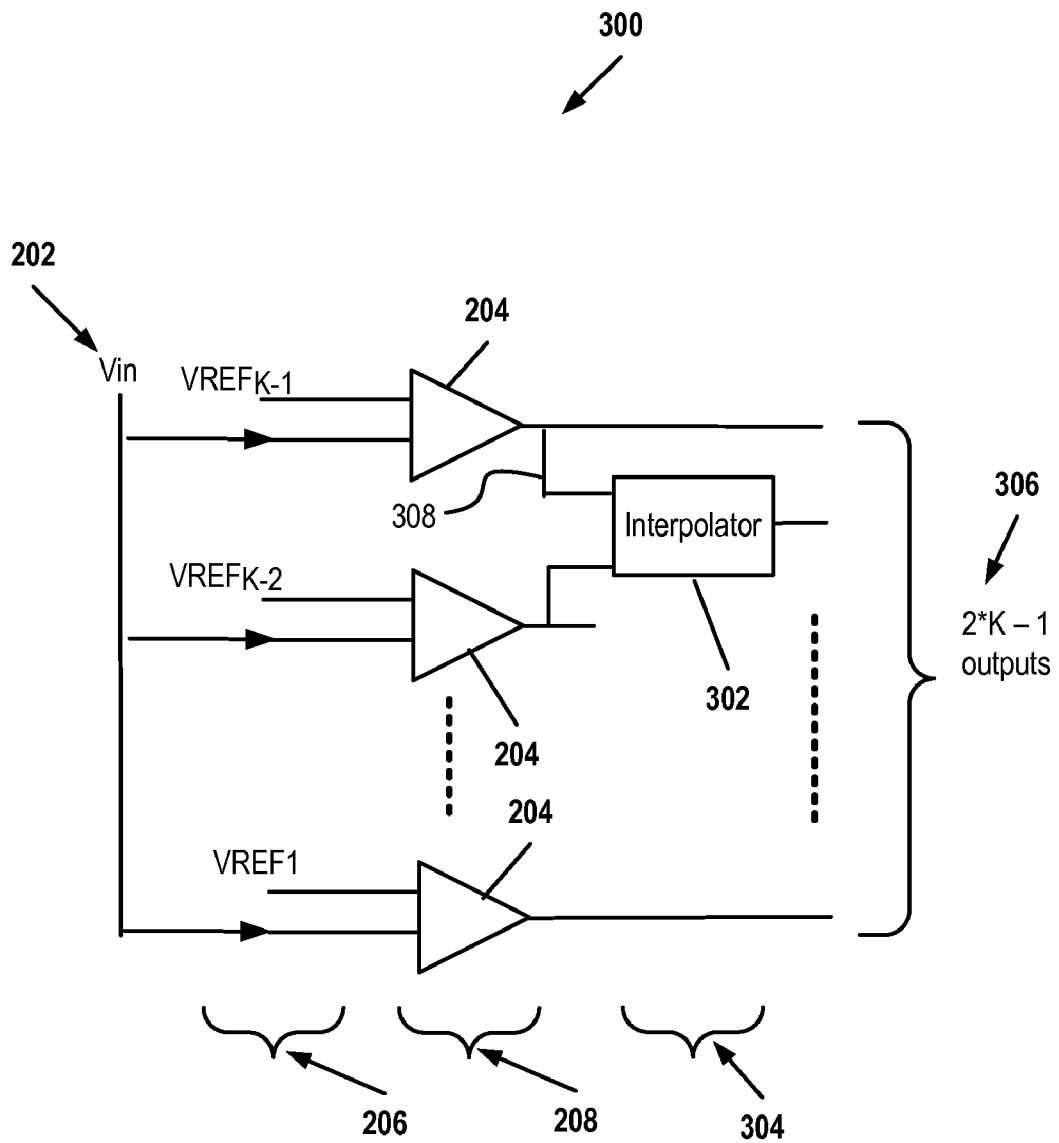
FIG. 3 is a block diagram depicting an exemplary compare section and an exemplary interpolate section, in accordance with certain configurations of the present disclosure.

FIG. 3 is a block diagram of an exemplary compare/interpolate block 300 comprising a compare block 154 and an interpolation block 156, in accordance with certain configurations of the present disclosure. Compare/interpolate block 300 may be used, for example, in an interpolated flash ADC implementation. Similar to compare block 200 (depicted in FIG. 2), compare/interpolate block 300 may comprise K comparators 204. However, in contrast to compare block 200, where K−1 outputs 210 may be produced, compare/interpolate block 300 may comprise 2*K−1 outputs. In other words, even though compare/interpolate block 300 may use the same number of comparators as compare block 200, compare/interpolate block 300 may produce more results of comparison of the input voltage signal 202 than compare block 200. Therefore, in one aspect, compare/interpolate block 300 may increase resolution of digital representation of input voltage signal 202. Conversely, for the same number of output signals (for the same resolution of bit representation), compare/interpolate block 300 may require half the number of comparators compared to compare block 200.

Still referring to FIG. 3, compare/interpolate block 300 comprises K−1 reference voltage signals 206 ($VREF_1$ to $VREF_{K-1}$), input to K−1 comparators 204. Outputs 308 of adjacent comparators (i.e., comparators corresponding to adjacent reference voltage signal values) may be input to K−2 interpolators 302. Interpolators 302 may perform interpolation (and comparison) operation, as further described below. In addition to the depicted interpolators 302 between adjacent comparators 204, two additional interpolators 302 may be used to interpolate between a zero signal level and $VREF_1$ and VREF and $VREF_{K-1}$ (not shown in FIG. 3). Therefore, output 306 of compare/interpolate block 300 may comprise 2*K−1 results of comparisons. In certain configurations, the plurality of interpolator blocks 302 (represented by callout 304) may correspond to the interpolation section 156. In certain configurations, interpolation section 304 may simply "pass through" results of comparisons from comparators 204 (corresponding to results of comparison with primary reference voltage signals).

It will be appreciated that the compare/interpolate block 300 depicted in FIG. 3 may facilitate digital representation of input analog signal 148 with a greater bit resolution than compare block 200 depicted in FIG. 2. Conversely, for the same output bit resolution, compare/interpolate block 300 may require fewer comparators 204 than compare block 200. In certain aspects, in compare/interpolate block 300, input voltage signal Vin 202 may have to be distributed to a fewer number of comparator blocks 204 than in compare block 200. This reduced distribution requirement may result in a lower output current requirement and therefore may simplify design of Vin 202 distribution circuit.

Figure 4:
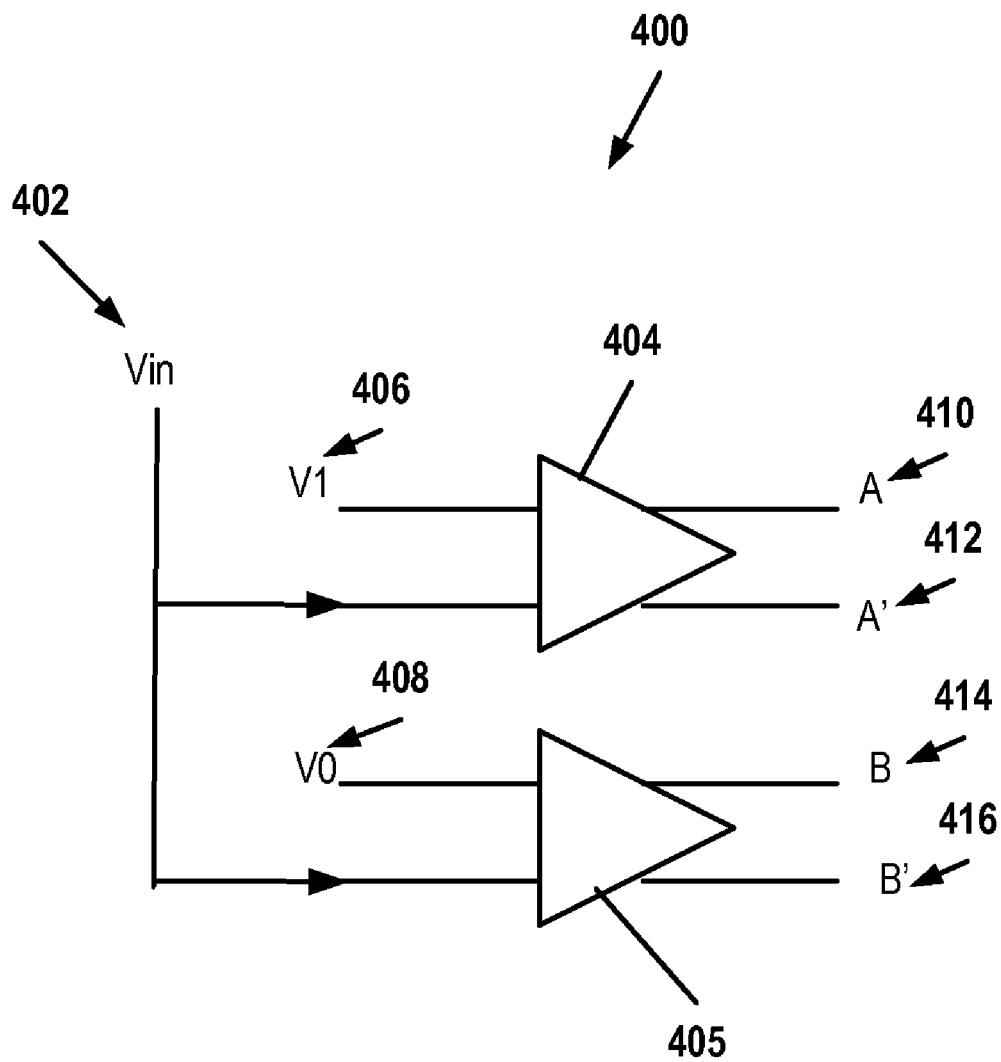
FIG. 4 is a block diagram of a portion of a compare section and a portion of an interpolate section, in accordance with certain configurations of the present disclosure.

FIG. 4 is a block diagram of a portion 400 of compare/interpolate block 300, in accordance with certain configurations of the present disclosure. FIG. 4 depicts two adjacent reference voltage signals, V0 408 and V1 406, from the plurality of reference voltage signals 206. Reference voltage signals V0 408 and V1 406 may be compared with reference input signal Vin 402 in comparator 404 and comparator 405 respectively. In certain configurations, comparators 404 and 405 may be identical to comparators 204 discussed with respect to FIGS. 2 and 3.

Still referring to FIG. 4, in certain configurations, comparator 404 may be a differential amplifier, producing differential outputs A 410 and A' 412. Outputs A 410 and A' 412 may form a differential pair of output voltage signals, representing voltage signals having same magnitude but opposite polarities. Similarly, comparator 405 may be a differential comparator configured to produce outputs B 414 and B' 416. Outputs B 414 and B' 416 may form a differential pair, representing voltage signals having same magnitude and different polarity. In certain configurations, differential comparators 404 and 405 may be operated in their "active" or "linear" range of operation. In the active range of operation, magnitudes of the output signals A 410 and A' 412 may be proportional to the difference (V1−Vin) in the signal values at the input of the differential comparator 404. Similarly, in the linear range of operation, the magnitudes of output signals B 414 and B' 416 may be proportional to the difference (V0−Vin). Therefore, a bit representation of the result of the comparison may be obtained by simply taking into account polarity of the differential outputs described above.

Figure 5:
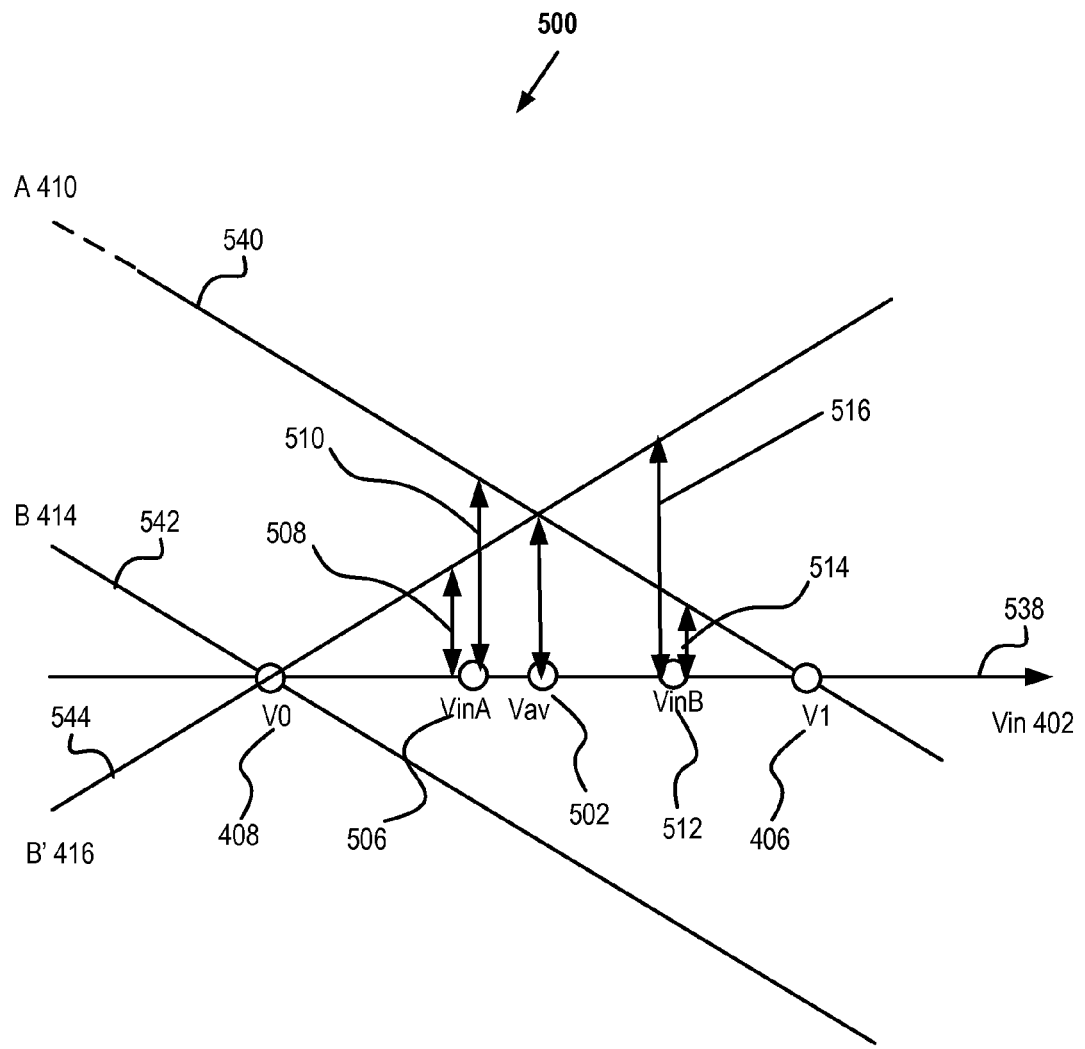
FIG. 5 is a graph depicting an exemplary input/output relationship for the portion depicted in FIG. 4, in accordance with certain configurations of the present disclosure.

FIG. 5 is a chart 500 showing signal outputs of the exemplary differential comparator circuits 404 and 405 depicted in FIG. 4, in accordance with certain configurations of the present disclosure. The X-axis 538 may represent signal values of Vin 402. Curve 540 may depict output A 410 as a function of Vin 402. As depicted in FIG. 5, when Vin=V1 (point 406 on curve 540), the difference signal at the input to comparator 404 may be zero, thereby producing output signal A 410 that may have a value zero. For values of Vin 402 less than V1 (to the left of point 406 on axis 538), the difference (V1−Vin) may be a positive value, resulting in a proportional positive voltage value of output A 510. A corresponding curve for output A' 412 is omitted from FIG. 5 to simplify the illustration, however it is understood that for each value of Vin 402, the corresponding value of A' 412 may have the same magnitude as A 410 but the opposite polarity.

Still referring to FIG. 5, curve 542 may represent dependence of output B 414 on input signal Vin 402. Outputs B 414 and B' 416 may form a differential signal pair, therefore curve 544 depicting B' 416 may have the same magnitude and opposite polarity. In certain configurations, the slope of curve 542 may be identical to the slope of curve 540. Each slope may be equal to a gain factor of the corresponding differential amplifier. When the value of input Vin 402 is midway between the values V0 and V1, as shown by the value Vav 502 on X-axis 538, output signals B' 416 and A 410 may be identical. When value of the input signal Vin 402 is between V0 408 and Vav 502 (e.g., VinA 506), signals A 410 and B' 416 may have the same polarity and magnitude of output A 410 (510) may be greater than magnitude of output B' 416 (508). Similarly, when for input signal value Vin 402 is in the range Vav≦Vin≦V1 (e.g., VinB 512) outputs A 410 and B'416 may have the same polarity but magnitude of signal A 410 (514) may be less than that of B'416 (516). In other words, when the input signal value is in the range V0≦Vin≦V1, the polarity of signal (A−B') may indicate whether signal Vin 402 is greater than or less than the average Vav. In other words, the polarity of signal (A−B') may simultaneously and implicitly perform interpolation and compare tasks, and produce an indication of whether the input signal Vin 402 is higher or lower in value than the average value Vav (Vav=(V0+V1)/2).

From the above discussion, it may be seen that in certain configurations, interpolator 302 (depicted in FIG. 3) may be operated as follows: A first output component from output of a comparator 204, and a second output component from the adjacent comparator 204, the first and the second output component having opposite polarities, may be input to interpolator 302. Output of interpolator 302 may represent a signal corresponding to a difference between the first output component and the second output component. The polarity of the output of interpolator 302 may provide indication of whether input voltage signal Vin 202 is greater than or less than (or equal to) the average of two reference voltage signal values of the corresponding comparators 204.

Designs of differential amplifiers to produce differential voltage outputs in response to differential voltage inputs are well known in the art. For example, differential amplifiers 404 and 405 and a circuit comparing signal A with signal B' may be implemented using voltage differential amplifiers. However, in practice, voltage-signal based implementation of compare/interpolate blocks may pose practical limitations. For example, a typical voltage differential amplifier may be implemented using an emitter follower that may suffer from degradation due to a capacitive coupling between input and output terminals (base and collector). Therefore, using typical voltage differential amplifiers may limit the speed of operation of the interpolation block 302. Furthermore, the dynamic range of operation of the comparator may be limited in voltage domain due to the upper limit of power supply voltage level. Furthermore, voltage interpolators may draw significant amount of power during operation.

Accordingly, in certain aspects, the present disclosure provides methods and circuits for compare and interpolation operations in the current domain. Current interpolation may have the advantage of having a higher dynamic range at least because current through a transistor can be made higher for the same voltage, by increasing conductance of the transistor. Similarly, interpolation in current domain may avoid capacitive coupling issues, thereby allowing fast signal transitions, thereby being more suitable for high speed implementations compared to voltage interpolation circuits.

Figure 6:
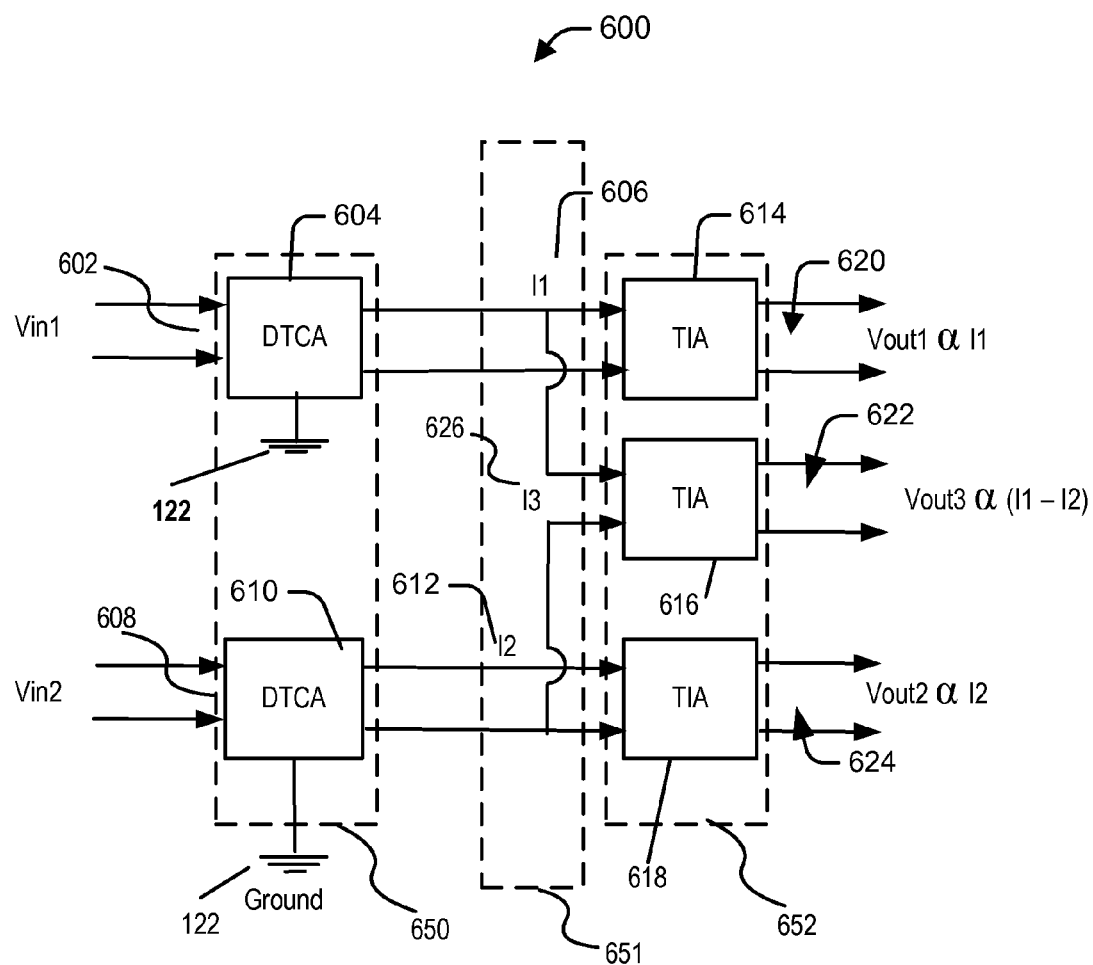
FIG. 6 is a block diagram illustrating an exemplary interpolator circuit, in accordance with certain configurations of the present disclosure.

FIG. 6 is a block diagram illustrating interpolator circuit 600, in accordance with certain configurations of the present disclosure. Circuit 600 comprises transconductive circuit 650 and transinductive circuit 652. Input voltage signals Vin1 602 and Vin2 608 may be input to transconductive circuit 650. In one aspect, Vin1 602 may correspond to signals Vin 402 and V1 406, and Vin2 608 may correspond to signals Vin 402 and V0 408, as described with respect to FIG. 4. Transconductive circuit 650 may comprise multiple differential transconductive amplifiers (DTCAs), for example, DTCAs 604 and 610. Input voltage signal Vin1 602 may be applied to the input of DTCA 604. Input voltage signal Vin2 608 may be applied to the input of DTCA 610. Each of Vin1 and Vin2 may represent a differential voltage signal. DTCA 604 may produce differential current output I1 606 proportional to input Vin1 602. The proportionality may be represented by a transconductance ratio g1=I1/Vin1 (units of mhos or siemens). DTCA 610 may produce differential current output I2 612 proportional to input Vin2 608. The proportionality may be represented by a transconductance ratio g2=I2/Vin2 (units of mhos or siemens). In one aspect, a term "signal" may refer to one or more signals, an input may refer to one or more inputs, and an output may refer to one or more outputs.

Still referring to FIG. 6, differential current signal I3 626 may be produced at the output of transconductive circuit 650 by forming, in an intermediate circuit 651, a differential pair from current signals from a first component of differential current output I1 606 and a second component of differential current output I2 612. For example, in certain configurations, the first component may be similar to output A 410 of FIG. 4, and the second component may be similar to output B' 416 of FIG. 4. In the configuration depicted in FIG. 6, differential current signal I3 626 may be generated from the components of differential current outputs 606 and 612 that have positive current values when the applied input voltages Vin1 602 and Vin2 608 are positive respectively. However, in certain configurations, components that have negative current values when the applied input voltages Vin1 602 and Vin2 608 are positive, respectively, may be used also.

Still referring to FIG. 6, the three differential current signals discussed above, viz. I1 606, I2 612 and I3 626, may be used as inputs to multiple transinductive amplifiers (TIAs), for example, TIAs 614, 616 and 618 respectively, of transinductive circuit 652. TIA 614 may be configured to produce output voltage signal Vout1 620 proportional to differential current signal I1 606. The proportionality may be represented by a transinductance ratio h1=I1/Vout1 (units of Henry). TIA 616 may be configured to produce output voltage signal Vout3 622 proportional to differential current signal I3 626. The proportionality may be represented by a transinductance ratio h3=I3/Vout3 (units of Henry). TIA 618 may be configured to produce output voltage signal Vout2 624 proportional to differential current signal I2 612. The proportionality may be represented by a transinductance ratio h2=I2/Vout2 (units of Henry). Each of Vout1, Vout2 and Vout3 may represent a differential voltage signal.

When used in a flash ADC system, interpolator circuit 600 may operate as follows according to one aspect of the disclosure. Differential output voltage signal Vout1 620 may be similar to the differential voltage pair (A 410, A' 412) at the output of comparator 404 (in FIG. 4). Differential output voltage signal Vout2 624 may be similar to the differential voltage pair (B 414, B' 416) at the output of comparator 405 (in FIG. 4). Differential output voltage signal Vout3 622 may be similar to the interpolated output signal (A 410, B' 416), as explained with respect to FIGS. 4 and 5. The polarity of each differential voltage signal output Vout1 620, Vout2 624 and Vout3 622 may indicate whether input signal Vin 202 (or 402) is greater than, less than or equal to reference voltage signal V1 406, V0 408 and the average (V0+V1)/2.

Figure 7:
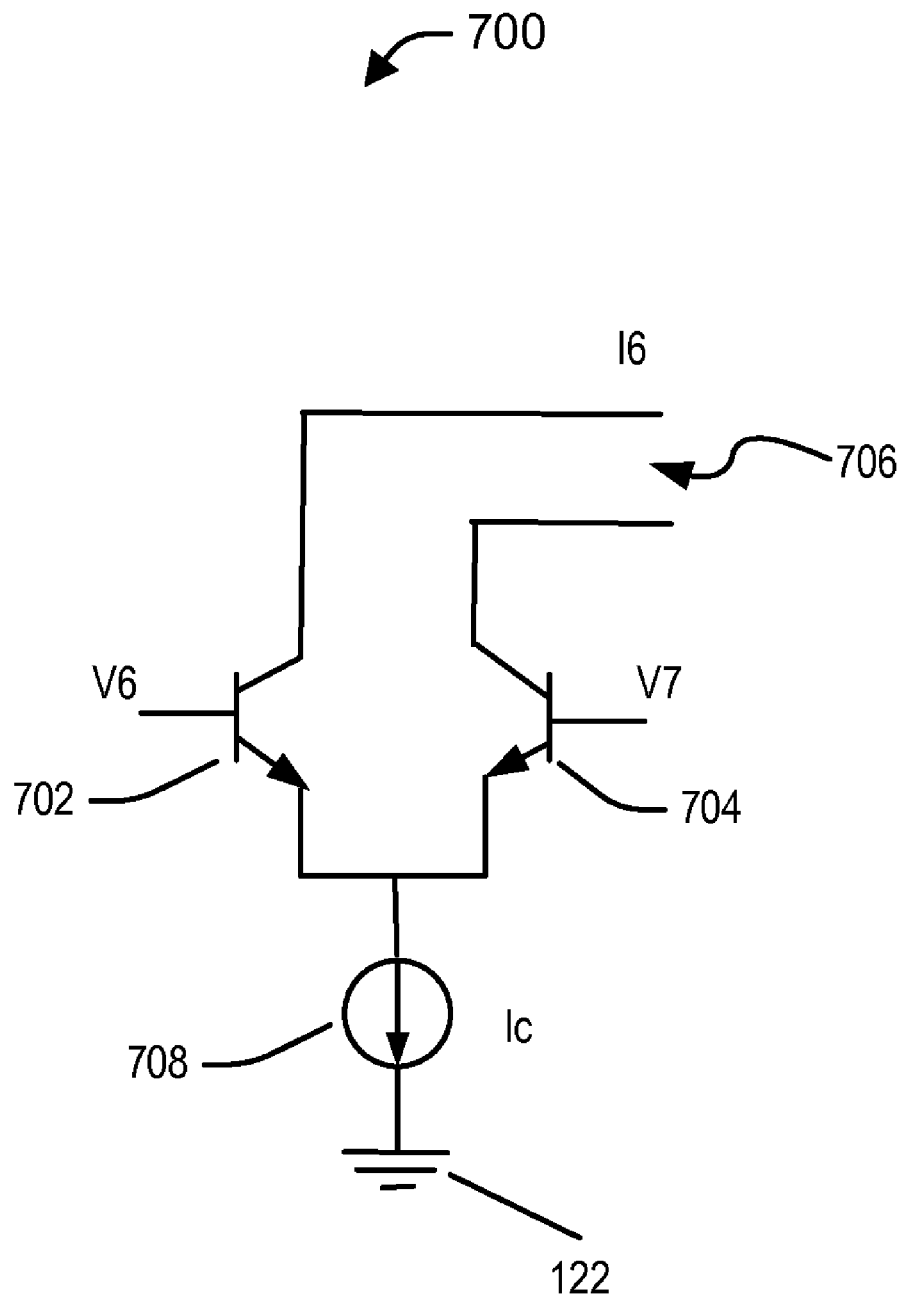
FIG. 7 is a circuit diagram illustrating an exemplary differential transconductance amplifier circuit, in accordance with certain configurations of the present disclosure.

FIG. 7 is a circuit diagram illustrating a differential transconductance amplifier (DTCA) 700, in accordance with certain configurations of the present disclosure. In certain configurations, TCA 700 may be used to implement DTCA 604 or DTCA 610. DTCA 700 may comprise BJT 702 and BJT 704 in an emitter coupled configuration. Emitters of BJT 702 and BJT 704 may be coupled to each other and further coupled to electrical ground 122 through current source 708. Current source 708 may nominally source current with magnitude Ic. A pair of differential input voltage signals V6 and V7 may be applied to bases of BJT 702 and BJT 704 respectively. Current signals at collectors of BJT 702 and BJT 704 may form a differential current output pair I6 706.

Still referring to FIG. 7, in the linear region of operation of DTCA 700, when voltage level of signal V6 is increased by a positive value Vdelta, because of the increased bias between base and emitter of BJT 702, more current may flow through collector of BJT 702, thereby causing a proportional increase in the value of differential current output I6 706.

Figure 8:
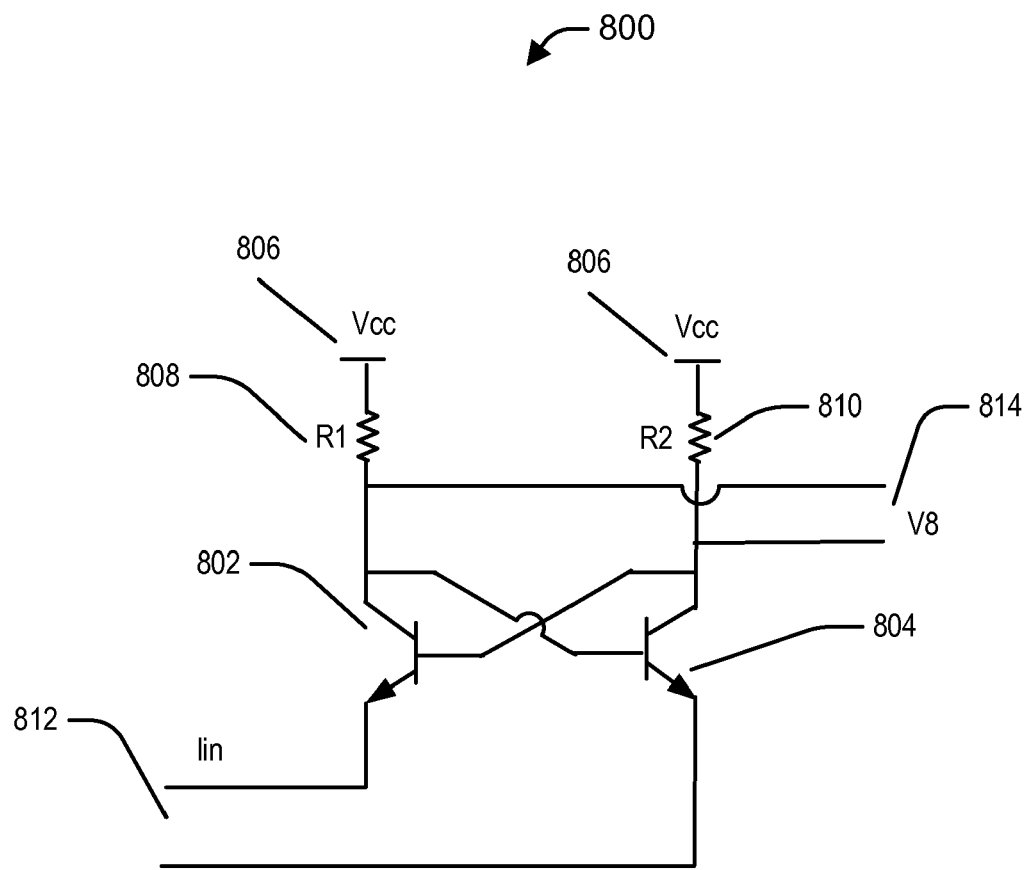
FIG. 8 is a circuit diagram illustrating a differential transinductance amplifier circuit, in accordance with certain configurations of the present disclosure.

FIG. 8 is a circuit diagram illustrating differential transinductance amplifier (TIA) 800, in accordance with certain configurations of the present disclosure. In certain configurations, TIA 800 may be used to implement TIA 614, 616 or 618 in FIG. 6. TIA 800 may comprise BJT 802 and BJT 804 configured so that differential current input Iin 812 may be applied to the emitters of BJT 802 and 804. Base of BJT emitter 802 may be coupled to a collector of BJT 804, and base of BJT 804 may be coupled to a collector of BJT 802. Differential output voltage signal V8 814 may be tapped between a collector of BJT 802 and a collector of BJT 804. A collector of BJT 802 may be coupled to voltage source Vcc 806 via resistor R1 808. A collector of BJT 804 may be coupled to voltage source Vcc 806 via resistor R2 810. In certain configurations, resistors R1 808 and R2 810 may be equal in value (units of ohms).

Still referring to FIG. 8, in operation, a change in the value of differential current input Iin 812 may result in a corresponding change in the amount of currents flowing through resistors R1 808 and R2 810, thereby causing differential output voltage signal V8 814 to change. In the linear region of operation of TIA 800, a change in the value of Iin 812 may cause a linearly proportional change in the value of V8 814.

It will be appreciated by practitioners of the art that the circuits and configurations described with respect to FIGS. 5 to 8 may be used for implementing comparators 204 and interpolators 302, shown in FIGS. 2 and 3.

It certain aspects, certain configurations of the present disclosure may be particularly suitable for a high speed implementation of flash ADC due to the use of bipolar junction transistors. In certain aspects aspect, certain configurations of the present disclosure may offer the advantage that because of the use of intermediate current signals, a higher dynamic range of signals may be possible.

It will further be appreciated that certain configurations of the present disclosure require a minimal number of circuit components for implementation. For example, a transconductive circuit configured to generate a plurality of differential current signals responsive to a plurality of reference voltage signals and an input voltage signal may comprise two bipolar junction transistors per each of the plurality of reference voltage signals. Furthermore, a transinductive circuit configured to generate, based on the plurality of differential current signals, a plurality of output voltage signals responsive to a digital representation of a value of the input voltage signal may comprise two bipolar junction transistors per each of the plurality of output voltage signals.

The subject technology is illustrated, for example, according to various aspects described below. Numbered clauses are provided below for convenience. These are provided as examples, and do not limit the subject technology.

The subject technology has been described with particular illustrative configurations. It is to be understood that the subject technology is not limited to the above-described configurations and that various changes and modifications may be made by those of ordinary skill in the art without departing from the scope if the subject technology. For example, various configurations may utilize bipolar complementary metal oxide semiconductor (BiCMOS) implementations using n-p-n bipolar junction transistors (BJT) and metal oxide semiconductor field effect transistors (MOSFETs). Practitioners of the art will recognize that several variations are possible by using different transistor configurations and substrates for implementation.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

In one aspect, the term "coupled" or the like may refer to being directly coupled. In another aspect, the term "coupled" or the like may refer to being indirectly coupled. In one aspect, a transistor may refer to a bipolar junction transistor, a field effect transistor, or the like.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An interpolation circuit for comparing an input voltage signal with an interpolated reference signal derived from a first reference voltage signal and a second reference voltage signal, the interpolation circuit comprising:
   a transconductive circuit configured to generate a first differential current signal proportional to a difference between the first reference voltage signal and the input voltage signal and a second differential current signal proportional to a difference between the second reference voltage signal and the input voltage signal;
   a transinductive circuit configured to generate an output voltage signal having a first polarity if a value of the input voltage signal is greater than a value of the interpolated reference signal and a second polarity if the value of the input signal is less than the value of the interpolated reference signal;
   wherein the interpolation circuit is configured to generate a third differential current signal using a first component current signal from the first differential current signal and a second component current signal from the second differential current signal; and
   wherein the interpolated reference signal comprises an average of the first reference voltage signal and the second reference voltage signal.

2. The interpolation circuit of claim 1, wherein the transconductive circuit comprises:
   a first differential transconductive amplifier (DTCA) circuit configured to produce the first differential current signal from a difference between the first reference voltage signal and the input voltage signal; and
   a second differential transconductive amplifier (DTCA) circuit configured to produce the second differential current signal from a difference between the second reference voltage signal and the input voltage signal.

3. The interpolation circuit of claim 2, wherein the first DTCA circuit comprises a first transistor and a second transistor coupled in a common emitter configuration, and the second DTCA circuit comprises a third transistor and a fourth transistor coupled in a common emitter configuration, and wherein
   a base of the first transistor is configured to receive the first reference voltage signal;
   a base of the second transistor is configured to receive the input voltage signal;
   a base of the third transistor is configured to receive the input voltage signal;
   a base of the fourth transistor is configured to receive the second reference voltage signal;
   an emitter of the first transistor and an emitter of the second transistor are coupled to an electrical ground via a current source;
   a collector of the first transistor and a collector of the second transistor are configured to generate the first differential current signal between the collector of the first transistor and the collector of the second transistor; and
   a collector of the third transistor and a collector of the fourth transistor are configured to generate the second differential current signal between the collector of the third transistor and the collector of the fourth transistor.

4. The interpolation circuit of claim 1, wherein the transinductive circuit comprises a first transinductive amplifier (TIA), the first TIA comprising:
   a first output transistor having an emitter configured to receive the first component current signal of the first differential current signal, and
   a second output transistor having an emitter configured to receive the second component current signal of the second differential current signal.

5. The interpolation circuit of claim 4, wherein:
   a base of the first output transistor is coupled to a collector of the second output transistor;
   a collector of the first output transistor is configured to be coupled to a voltage source via a first resistor;
   a base of the second output transistor is coupled to the collector of the first output transistor;
   the collector of the second output transistor is configured to be coupled to the voltage source via a second resistor; and
   the output voltage signal is generated between the collector of the first output transistor and the collector of the second output transistor.

6. The interpolation circuit of claim 4, wherein the transinductive circuit further comprises:
   a second TIA configured to produce a first differential output voltage signal proportional to the first differential current signal, and a third TIA configured to produce a second differential output voltage signal proportional to the second differential current signal.

7. The interpolation circuit of claim 6, wherein each of the first TIA, the second TIA and the third TIA comprises a pair of bipolar junction transistors.

8. The interpolation circuit of claim 1, wherein a flash analog to digital converter comprises the interpolation circuit.

9. A method for comparing an input voltage signal with an interpolated signal derived from a first reference voltage signal and a second reference voltage signal, the method comprising:
   operating a transconductive circuit to generate a first differential current signal proportional to a difference between the first reference voltage signal and the input voltage signal and a second differential current signal proportional to a difference between the second reference voltage signal and the input voltage signal;
   generating a third differential current signal using a first component current signal from the first differential current signal and a second component current signal from the second differential current signal; and
   operating a transinductive circuit to generate an output voltage signal having a first polarity if a value of the input voltage signal is greater than a value of the interpolated signal and a second polarity if the value of the input signal is less than the value of the interpolated signal.

10. The method of claim 9, wherein the operating the transconductive circuit comprises:
   operating a first differential transconductive amplifier (DTCA) circuit to generate the first differential current signal comprises generating the first differential current signal from a difference between the first reference voltage signal and the input voltage signal, and
   operating a second DTCA circuit to generate the second differential current signal comprises generating the second differential current signal from a difference between the second reference voltage signal and the input voltage signal.

11. The method of claim 10, wherein the operating the first DTCA circuit further comprises:
   applying the first reference voltage signal to a base of a first transistor;
   applying the input voltage signal to a base of a second transistor and a base of a third transistor;
   applying the second reference voltage signal to a base of a fourth transistor;
   generating the first differential current signal between collectors of the first transistor and the second transistor; and
   generating the second differential current signal between collectors of the third transistor and the fourth transistor;
   wherein an emitter of the first transistor is coupled to an emitter of the second transistor and is further coupled to an electrical ground via a current source.

12. The method of claim 9, wherein the operating the transinductive circuit comprises:
   operating a first output transistor by providing the first component current signal of the first differential current signal to an emitter of the first output transistor; and
   operating a second output transistor by providing the second component current signal of the second differential current signal to an emitter of the second output transistor.

13. The method of claim 12, further comprising:
   operating the first output transistor by applying a voltage of a voltage source to a collector of the first output transistor via a first resistor and by applying the voltage of the voltage source to a base of the first output transistor via a second transistor;
   operating the second output transistor by applying the voltage of the voltage source to a collector of the second output transistor via the second resistor and by applying the voltage of the voltage source to a base of the second output transistor via the first resistor; and
   operating the first output transistor and the second output transistor to generate the output voltage signal between the collector of the first output transistor and the collector of the second output transistor.

14. The method of claim 12, further comprising:
   generating a first differential output voltage signal proportional to the first differential current signal, and
   generating a second differential output voltage signal proportional to the second differential current signal.

15. The method of claim 14, wherein each of the first output transistor and the second output transistor is a bipolar junction transistor.

16. An interpolation circuit comprising:
   a transconductive circuit configured to generate a plurality of differential current signals responsive to a plurality of reference voltage signals and an input voltage signal; and
   a transinductive circuit configured to generate, based on the plurality of differential current signals, a plurality of output voltage signals responsive to a digital representation of a value of the input voltage signal,
   wherein the number of the plurality of output voltage signals is greater than the number of the plurality of reference voltage signals.

17. The interpolation circuit of claim 16, wherein the transinductive circuit comprises two bipolar junction transistors per each of the plurality of output voltage signals.

18. An interpolation circuit comprising:
   a transconductive circuit configured to generate a plurality of differential current signals responsive to a plurality of reference voltage signals and an input voltage signal; and
   a transinductive circuit configured to generate, based on the plurality of differential current signals, a plurality of output voltage signals responsive to a digital representation of a value of the input voltage signal,
   wherein the transconductive circuit comprises two bipolar junction transistors per each of the plurality of reference voltage signals.

19. The interpolation circuit of claim 18, wherein the transinductive circuit comprises two bipolar junction transistors per each of the plurality of output voltage signals.

* * * * *